United States Patent [19]

LeCardonnel et al.

[11] 4,088,993

[45] May 9, 1978

[54] DEVICE FOR ENCODING A PLURALITY OF ANALOGICAL SIGNALS

[75] Inventors: Gerard LeCardonnel; Pierre Gravez; Rene Marc Favre, all of Paris, France

[73] Assignee: Thomson-CSF, Paris, France

[21] Appl. No.: 696,416

[22] Filed: Jun. 15, 1976

[30] Foreign Application Priority Data

Jun. 20, 1975 France .................. 75 19409

[51] Int. Cl.² ............................ H03K 13/20
[52] U.S. Cl. ................. 340/347 AD; 340/347 DA
[58] Field of Search .... 340/347 M, 347 AD, 347 DA

[56] References Cited

U.S. PATENT DOCUMENTS

| 3,582,940 | 6/1971 | Kihlberg | 340/347 AD |
| 3,806,810 | 4/1974 | Widmer | 340/347 M |

FOREIGN PATENT DOCUMENTS

| 2,133,522 | 1/1972 | France | 340/347 M |

OTHER PUBLICATIONS

Johannesen, "Electronics Letters", 23rd Sep. 1971, vol. 7, No. 19, pp. 593–594.
Hoeschele, "Analog-To-Digital/Digital-To-Analog Conversion Techniques", © 1968, pp. 108–109, 116–119.

Primary Examiner—Charles D. Miller
Attorney, Agent, or Firm—Cushman, Darby & Cushman

[57] ABSTRACT

A device intended for the encoding of PCM telephone signals, the system comprising in particular a reference voltage generator reproducing the 8 linear segments of the standardized compression law, a comparator which is supplied at one of it's inputs with the aforesaid reference signal and, at the other, with the previously sampled signal of unknown level, this after the possible reversal of the two signals in order to give them the same polarity and after the sign of the sample has been determined by the temporary application to the reference input of the comparator of a signal of zero level.

6 Claims, 5 Drawing Figures

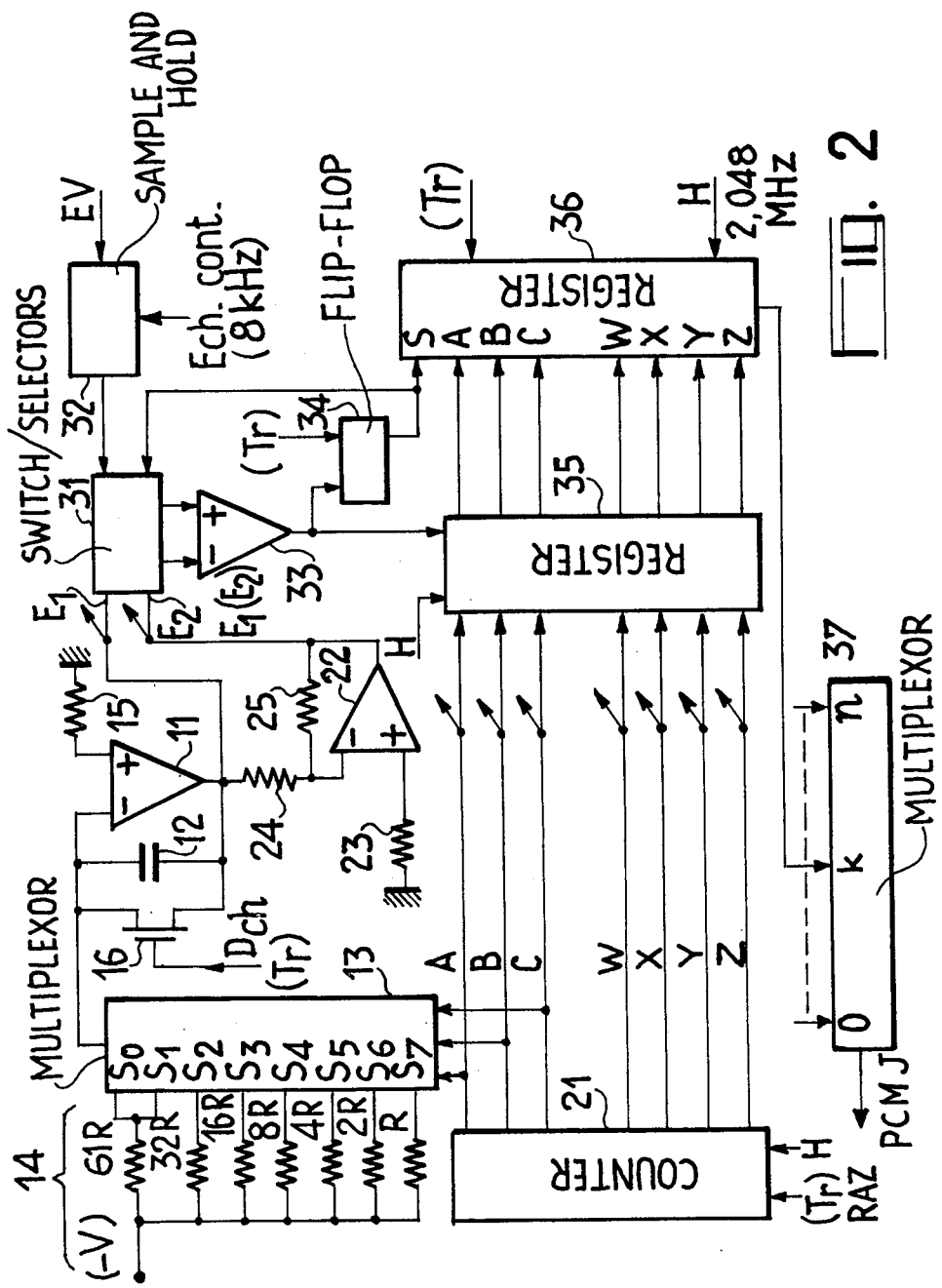

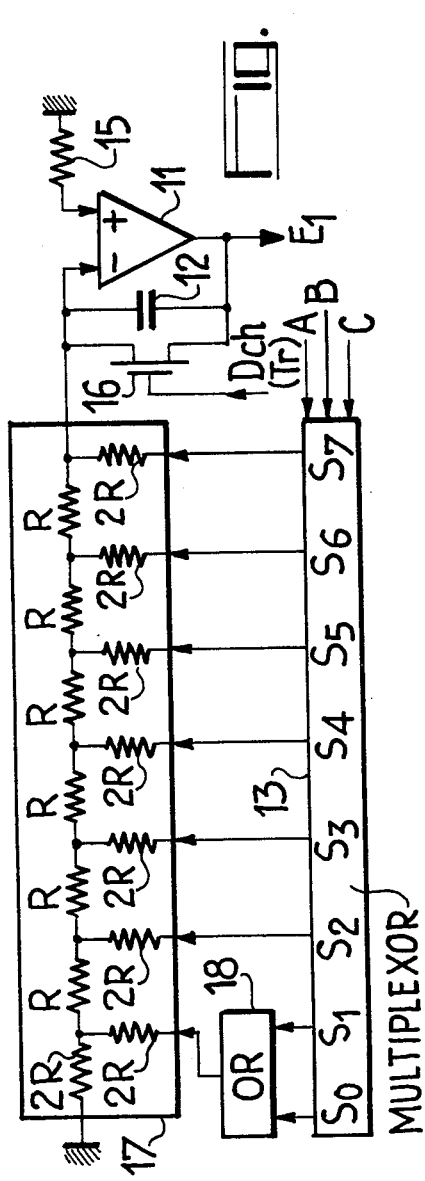
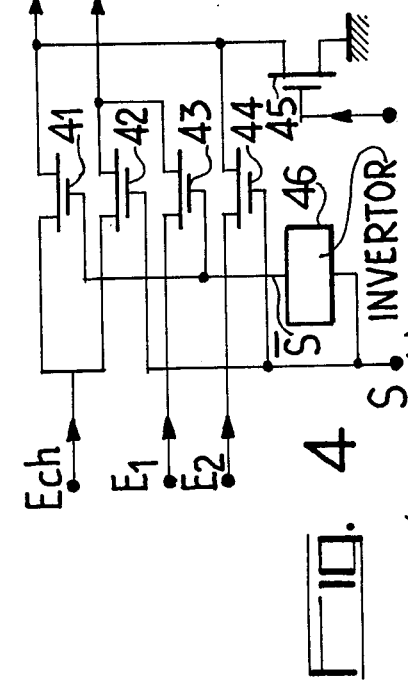
FIG. 3
FIG. 4

DEVICE FOR ENCODING A PLURALITY OF ANALOGICAL SIGNALS

The present invention relates to a coding circuit which can be used for PCM — type telephone transmissions.

Those skilled in the art will be aware that in this kind of transmission system, an attempt is made to improve the signal -to- noise ratio at low levels, by compressing the signal levels at transmission in accordance with a given law and by carrying out a reverse procedure of expansion at the receiving end. In accordance with the usual conventions, the coding characteristic used is constituted by eight rectilinear segments (Nos. 0 to 7 inclusive) the slope of which is multiplied by a coefficient equal to 2 with each transition from one segment to the next, this with the exception of the first two segments (Nos. 0 and 1), corresponding to the lowest levels, the slopes of which are identical; the order of the selected segment is coded in a natural binary code comprising 3 binary digits (A, B, C). The selected segment itself is replaced by a step curve defining six separate quantising levels, the retained level subsequently being encoded in a natural binary code comprising 4 binary digits (W, X, Y, Z). Finally, and taking account of the sign binary digit (S), the sampled signal is represented by a code with 8 binary digits, of the form (S, A, B, C, W, X, Y, Z).

Those skilled in the art will be aware of several devices which make it possible to achieve this kind of coded representation.

We will consider first of all encoders of the back-flow kind in which the code (A, B, C) defining the segment to which the input level belongs, is obtained by counting pulses, the level being compared with a reference voltage Er and being successively multiplied by 2 as many times as required in order to reach and exceed Er at the output; the code (W, X, Y, Z) defining the position of the input level on the selected segment is obtained by recording, in a shift-register, a binary digit 1 if the output level is greater than Er, and by subtracting Er from it before doubling the difference, or by recording a binary digit 0 if the output level is less than Er.

Mention must be made, too, of encoders of the "parallel" type in which the input level for coding is compared with threshold means in a non-linear progression in order to select that segment of the compression law to which it belongs, and therefore the code (A, B, C), whereafter it is compared with a series of linearly progressing thresholds supplied at variable voltages with the segment selected for determinating the code (W, X, Y, Z).

These encoders are faster than the ones first described but also considerably more complex and expensive.

In accordance with the present invention, it is provided a device for encoding a plurality of analogical signals incoming respectively onto $n$ incoming circuits into a plurality of digital signals, said digital signals being multiplexed onto a single output circuit, said device comprising:

a single slope generator for delivering under the control of a clock signal a voltage slope according to a defined encoding law;

first means for comparing successively each of said analogical signals with said voltage slope and delivering a set signal when said voltage slope becomes higher than said analogical signal;

second means for counting said clock signal and delivering a succession of digital numbers; and third means for delivering said digital numbers onto said single output circuits under the control of said set signal.

For a better understanding of the invention, and to show how the same may be carried into effect, reference will be made to the ensuing description and to the attached figures among which:

FIG. 2 illustrates the block diagram of an n-channel encoder in accordance with the invention;

FIG. 3 illustrates a variant embodiment of the slope generator;

FIG. 4 illustrates a preferred embodiment of one of the switch/selectors assigned to each of the channels;

Figure 1:
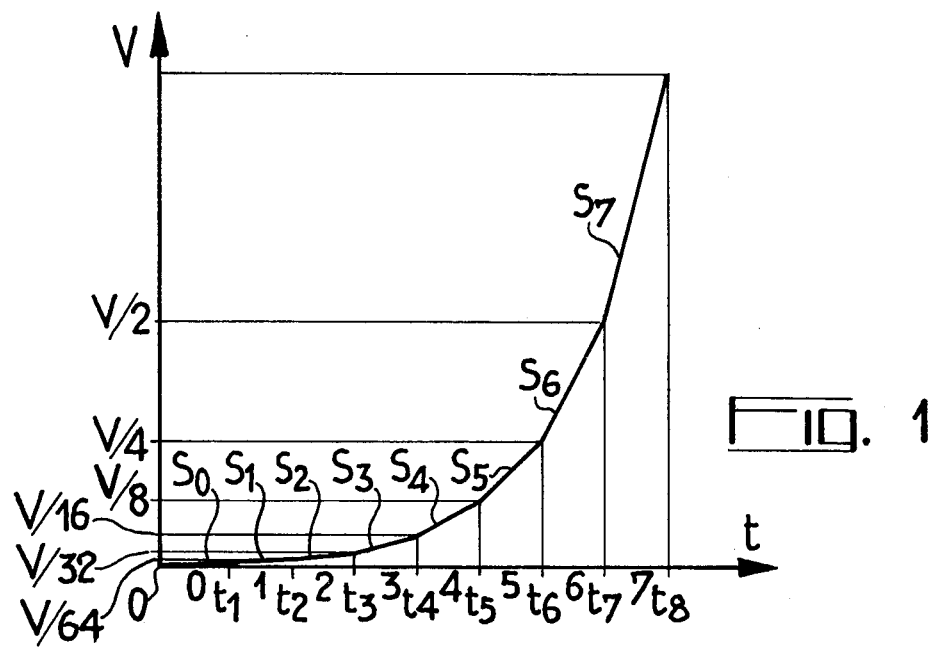
FIG. 1 illustrates a coding characteristic used.

In FIG. 1, the shape of the standardised encoding characteristic with it's 8 segments, can be seen. The abscissas are divided into mutually equal time intervals respectively designated by the consecutive whole integer values from zero inclusive (lowest levels) to 7 inclusive (highest levels), with which there respectively correspond the segments $S_0$, $S_1$, $S_2$, $S_3$, $S_4$, $S_5$, $S_6$ and $S_7$.

The ordinates are graduated in voltage levels; the highest level is designated by V and it is a straightforward matter to determine the values of the levels at the beginning and end of each segment as follows:

| | | | |
|---|---|---|---|
| $S_0$ | from 0 | to | V/128 |
| $S_1$ | from V/128 | to | V/64 |
| $S_2$ | from V/64 | to | V/32 |
| $S_3$ | from V/32 | to | V/16 |
| $S_4$ | from V/16 | to | V/8 |
| $S_5$ | from V/8 | to | V/4 |
| $S_6$ | from V/4 | to | V/2 |
| and $S_7$ | from V/2 | to | V |

A reference voltage in accordance with the 8 — segment characteristic, which has just been described, can be generated by a generator constituting one of the essential parts of the $n$ — channels encoder in accordance with the invention. The general design of this kind of encoder has been illustrated by way of non-limitative example in FIG. 2. The reference voltage generator is constituted by an integrator comprising an operational amplifier 11 of low output impedance, an integrating capacitor 12 and a multiplexor 13 which can place in series with the capacitor 12 one of the seven resistors 14 whose resistances increase in accordance with a geometric progression of ratio 2.

The operational amplifier 11 has two inputs: a(+) input earthed across a resistor 15 and a (−) input connected to the summing point of the integrator. When the element 64R of the set of resistors 14 is connected to said point by the mean of the multiplexor 13, the integrator furnishes at it's output a voltage $E_1$ which rises linearly in accordance with the law:

$$E_1 = \frac{-t \cdot (-V)}{64\,RC}$$

where $t$ designates the instant in question, $(-V)$ the negative voltage applied to the free end of the resistor in question and C the capacitance of the capacitor 12, thus producing the segment 0 of the standardised encoding characteristic.

If, at the instant $t_1$ shown in FIG. 1, the multiplexor 13 is switched connecting the same element 64 R to the summing point of the integrator, the output signal produces a linear voltage of the form:

$$E_1 = \frac{-t_1(-V)}{64\,RC} - \frac{(t-t_1)(-V)}{64\,RC} = \frac{-t(-V)}{64\,RC}$$

corresponding to segment 1 of the characteristic which is arranged in extension of segment zero.

At the instant $t_2 = 2\,t_1$ shown in FIG. 1, the multiplexor 13 is switched again and connects an element 32 R of the set of resistors 14 to the summing point of the integrator. The output signal then becomes:

$$E_1 = \frac{-t_2(-V)}{64\,RC} - \frac{-t(-V)}{32\,RC}$$

thus, up to the time $t_3 = 3\,t_1$, defining the segment 2 of FIG. 1, whose slope is double that of the segments zero and 1.

It will readily be appreciated that gradually it is the set of segments from 0 – 7 inclusive, of the standardised characteristic, which come to be represented by the output signal $E_1$ of the integrator.

The latter circuit is supplemented by a static switch 16 of CMOS kind connected in parallel with the integrating capacitor 12 in order to discharge the latter under control of the leading edge of the frame sync. pulse (Tr): to this end, a circuit of conventional and commercial 4016 type can be used for example and the capacitor 12 can have it's discharge controlled by applying the frame signal to the control input Dch of the switch 16, thus driving the latter temporarily conductive.

The operation of the multiplex 13 is controlled by the binary signals coming from the outputs (ABC) of highest weighting factor of a pulse counter 21 also provided with four other outputs (W X Y Z) corresponding to the lower weighting factors, these latter signals being used to encode the position of the samples signal on the segment. The frame synchronising signal Tr applied to the input RAZ of the counter 21 with a frequency equal to the channel sampling frequency, namely 8 kilohertz, causes the resetting of the counter to zero; the counter is advanced by applying to the input H the pulses coming from a clock whose frequency is fixed at a value at least equal to:

$(2^7 \times 8)$KHz = 1,024 MHz and may for example be made equal to 2.048 MHz.

Also visible in FIG. 2 is an inverter constituted by an operational amplifier 22 with a low output impedance, and three resistors. Resistor 23 whose ends are connected respectively to the (+) input of the amplifier and to earth, and the two resistors 24 and 25 of mutually identical resistance, which are supplied in the case of the former with the input signal $E_1$ coming from the slope generator and in the case of the second with the inverted output signal $E_2 = -E_1$ which is applied for feedback purposes to the (−) input of the amplifier 22.

The signals $E_1$ and $E_2$ are applied simultaneously to a set of $n$ switch/selectors 31 equal in number to the number of channels of the encoder, whose function is to select that of the two signals $E_1$ or $E_2$ which is to be retained as reference signal, taking account of the polarity of the signal sampled at the rate of 8 Kilohertz and applied, furthermore, after storage to the input Ech of the circuit in question, by the sample-and- hold circuit 32 to whose "channel input" EV the analogue signal coming from the corresponding channel is applied. The signal, $E_1$ or $E_2$, retained as reference, is always a signal of the same polarity as the sample: the signal $E_1$ if the signal is of positive polarity, the signal $E_2 = -E_1$ if the sample is negative.

The signal in question ($E_1$ or $E_2$) is applied by the relevant switch/selector 31 to the (−) input of a comparator 33 and the sample (Ech) to the (+) input of the same comparator which furnishes at the output a binary signal of value 1 if $E_1$ (or $E_2$) > |Ech| and a binary signal of value 0 if $E_1$ (or $E_2$) < |Ech|.

A flip-flop 34 is assigned to the storage of the sign of the sample and does so as soon as each fresh sequence starts, whilst the integrating capacitor 12 is discharged. At this instant, in other words, the voltage at the (−) input of the comparator 33 is zero so that the binary signal appearing at the output of the latter acquires a value in accordance with the sign of the sample. The binary value obtained is transferred for storage in the flip-flop 34 under the control of the trailing edge of the frame sync. pulse Tr already used (through the agency of it's leading edge) to control the discharge of the capacitor 12 and reset the counter 21. The binary sign digit S then appears at the output of the trigger stage 34 and is stored throughout the time of the sequence.

During the same sequence, the output signal from the comparator 33, which has the binary value 0 as long as $E_1$ (or $E_2$)< |Ech|, enables the transfer after each clock pulse H, of the content of the counter 21 to the intermediate register 35 assigned to the channel in question, up to the time at which the binary value 0 at the output of the comparator 33 is replaced by a binary digit 1, characterising the condition: $E_1$ (or $E_2$) ≥ |Ech|. From this moment onwards, transfer of the contents of the counter 21 to the intermediate register 35 is inhibited and the code stored in this register is fixed there until the end of the sequence. At that moment application of the frame signal to the output register 36 causes parallel transfer of the code stored by the intermediate register 35 to the output register 36 which thus stores the desired code (S A B C W X Y Z) corresponding to the value of the selected sample.

During the next sequence, the output register 36 is emptied binary digit by binary digit under the control of the clock signals (H), so that a serial transmission of the elements of the selected code is effected, these elements to this end making use of the output numerical multiplexor 37, provided that the latter has enabled the channel in question, and appearing at the PCM junction.

The design of the pulse counter 21 is conventional as also is that of the intermediate register 35, the ouput register 36 and the numerical multiplexor 37.

By contrast, the switch/selectors 31 and the sample-and-hold circuit 32 are of original design.

FIG. 3 illustrates another variant embodiment of the slope generator in accordance with the invention. In this variant embodiment, the multiplexor 13 is no longer used in the way which it is in FIG. 2, to switch the resistor in series with the capacitor 12 but is used instead to control, via a network of resistors 17, the constant current charging of the same capacitor at a current level which doubles with each switching operation.

The network 17 is constituted by 7 L — cells each comprising a shunt resistor 2R and a series resistor R with the exception of the first cell in which the earthed series resistor has a resistance of 2R. Each of the shunt resistors is connected to one of the outputs of the multiplexor 13, with the exception of that belonging to the first cell, which is connected to the outputs $S_0$ and $S_1$ of the multiplexor through the medium of an OR — gate 18 in order, in respect of the low levels to produce two segments of the same slope located in extension of one another on the coding characteristic.

At each instant one (and one only) of the L — cells in the network 17, designated by the coded combination (ABC), is supplied via it's shunt resistor 2R with a single signals of binary value equal to 1, whilst all the others receive a non single signal of binary value equal to 0. In accordance with a known property of network of this kind, the network 17 behaves as a fictive generator of constant internal resistance equal to R, whose electromotive force can acquire the following levels by varying the coded combinations (ABC) in rising values:

| | | | |
|---|---|---|---|
| V/64 | if (ABC) = 000 | or 001 | (segments 1 and 2) |
| V/32 | if (ABC) = 010 | | (segment 3) |
| V/16 | if (ABC) = 011 | | (segment 4) |
| V/8 | if (ABC) = 100 | | (segment 5) |
| V/4 | if (ABC) = 101 | | (segment 6) |
| V/2 | if (ABC) = 110 | | (segment 7) |
| V | if (ABC) = 111 | | (segment 8) | the electro-motive force V/64 being applied during twice as long a time interval as the others.

Under these circumstances, the charge acquired by the capacitor 12 increases linearly as a function of time, with a slope which doubles with each switching operation, thus making it possible to obtain the desired coding characteristic.

The significance of this variant embodiment of the slope generator resides on the one hand in the fact that the network 17 utilises only two different values, R and 2R, for it's resistors, and on the other hand in the maintaining of the internal resistance of the generator at a constant value R irrespective of the particular segment on the charging characteristic, which is involved.

Each of the switch/selectors 31 shown in FIG. 2, the preferred diagram of which has been shown in FIG. 4, comprises five circuits 41, 42, 43, 44 and 45 of the CMOS kind and an inverter 46. The circuits 41 and 42 are assigned to the transmission of the sample (Ech) to the two inputs (+) and (−) of the comparator 33 shown in FIG. 2; the circuits 43 and 44, when conductive, transmit to the said same comparator in the case of the first of them the voltage ($E_1$) furnished by the slope generator and in the case of the second of them the voltage $E_2 = -E_1$ coming from the inverter of FIG. 2. The state, conductive or blocked, of the circuits 42 and 44 is controlled by the binary signal S indicating the sign of the sample and applied to the line Rev.Cont.; the state of the circuits 41 and 43 is controlled by the signal $\overline{S}$ generated by the inverter 46 from the signal S. If the sample is positive, the reference signal to be selected is the signal ($E_1$). The sample is then transmitted by the circuit 41 to the input (+) of the comparator and the signal ($E_1$) to the input (−) of said same comparator, the two other circuits 42 and 44 then being blocked by the signal $S = 0$. If, on the other hand, the sample is negative, the reference signal to be selected is the signal ($E_2$): the sample, in this case, is transmitted to the input (−) of the comparator by the circuit 42 which has been driven conductive by the signal $S = 1$, and the signal ($E_2$) is transmitted to the input (+) of the comparator, the two circuits 41 and 43 being blocked at the same instant.

The function of the circuit 45 is to apply to the input (+) of the comparator at the commencement of each new sequence and when the sign of the sample has not yet been determined, the zero earth potential, this even if the integrating capacitor 12 has not yet fully discharged. The circuit 45 is controlled to this end by the frame sink signnal (Tr) which drives a circuit conductive as long as it is applied, but only for that period of time.

Figure 5:
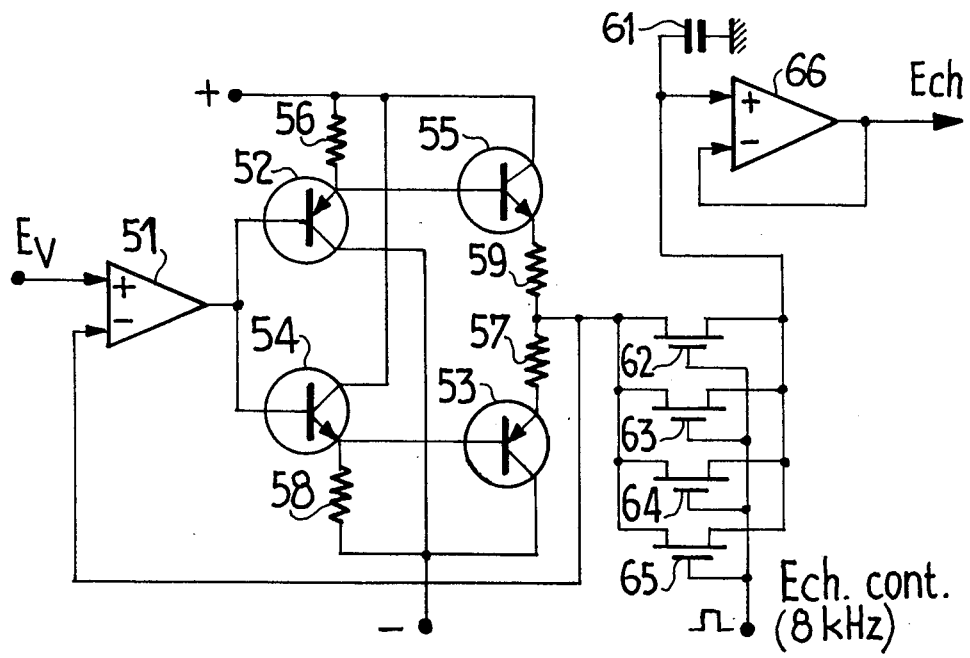
FIG. 5 illustrates the design of a sample-and- hold circuit.

FIG. 5 illustrates a preferred embodiment of one of the sample-and-hold circuits 32 of FIG. 2. The channel signal for sampling is applied to the line EV (input channel) connected to the input (+) of an input operational amplifier 51 whose output controls a double intermediate power amplifier stage constituted by two PNP transistors 52 and 53, two NPN transistors 54 and 55 and the assembly of resistors 56, 57, 58 and 59. The circuit, derived from the classic DARLINGTON circuit, makes it possible to effect low-impedance transmission either of positive signal supply to the input EV or of negative signals. A feedback connection is established between the output of this stage and the input (−) of the input amplifier 51.

The storing of the sample is achieved by charging the capacitor 61 using a set of CMOS circuits connected in parallel in order to yield a sufficiently high powered charging current, in this case four circuits 62, 63, 64 and 65, the conductive state of which is controlled simultaneously by the application of the 8 kilohertz signal to the line Ech. Cont.

The circuit is completed by an output amplifier 66 of high input impedance, supplied at it's input (+) with the voltage appearing across the terminals of the capacitor 61, and having an input (−) connected to the output (Ech) where there appears across a low impedance the stored sample, ready now for processing in the switch/selector 31 assigned to the particular channel.

It should be pointed out that in the encoder in accordance with the invention cross talk between channels can only occur through the medium of the inputs of the switch/selectors 31. However, the reference voltages $E_1$ and $E_2$ are generated across a low impedance whereas the input impedance of each of the systems 31 and 33 is high. The result is that the parasitic coupling and consequently the cross talk between neighbouring channels, will be very small and this constitutes a new advantage of the proposed circuit.

The encoder in accordance with the invention is applicable to all cases of PCM transmission in which it is desired to effect an economic design and where the coding speed is relatively slow.

What we claim is:

1. A PCM encoder for encoding a plurality of parallel incoming analogical signals into a plurality of serially multiplexed output digital signals, which comprises:
   means for counting the pulses of an external clock signal, and for delivering an internal digital signal comprising a first plurality of high-weight bits and a second plurality of low-weight bits;
   means for delivering a succession of increasing voltages under the control of said high-weight bits;
   means for integrating said increasing voltages, delivering a first slope voltage increasing from a zero value;

means for inverting said first slope voltage, delivering a second slope voltage decreasing from a zero value;

means for sampling and holding said incoming analogical signals, and for delivering a plurality of samples;

means for selecting one of said first and second slope voltages and successively each of said samples;

means for comparing the selected slope voltage and the selected sample, delivering a comparison bit marking the sign of the difference between said selected slope voltage and said selected sample;

means for storing said internal digital signal under the control of said comparison bit when said sign of said difference changes; and means for serializing the stored internal digital signal, and for delivering said serially multiplexed output digital signals.

2. An encoder as claimed in claim 1, further comprising a flip-flop circuit for memorizing the value of said comparison bit at the beginning of said slope voltages, and delivering a sign bit to said selecting means and to said storing means.

3. An encoder as claimed in claim 2, wherein said increasing voltages delivering means comprise a plurality of staggered resistors connected to a fixed voltage source, and a multiplexer for successively connecting under the control of said high-weight bits each of said resistors to said integrating means.

4. An encoder as claimed in claim 2, wherein said increasing voltages delivering means comprise a constant internal resistance L network comprising series resistors and shunt resistors, and a multiplexor for successively feeding under the control of said high-weight bits each of said shunt resistors with a fixed value voltage; said integrating means being connected to the output of said network.

5. An encoder as claimed in claim 2, wherein said selecting means comprise a plurality of identical circuits parallel connected by a positive connection and a negative connection to said comparing means, each of said identical circuits comprising:

an inverter receiving said sign bit for delivering an opposite sign bit;

a first CMOS circuit for receiving one of said samples and delivering said one sample onto said positive connection under the control of said opposite sign bit;

a second CMOS circuit for receiving said one sample and delivering said one sample onto said negative connection under the control of said sign bit;

a third CMOS circuit for receiving said first slope voltage and delivering said first slope voltage onto said negative connection under the control of said opposite sign bit;

a fourth CMOS circuit for receiving said second slope voltage and delivering said second slope voltage onto said positive connection under the control of said sign bit; and a fifth CMOS circuit for earthing said positive connection under the control of an external signal marking said beginning of the slope voltages.

6. An encoder as claimed in claim 1, wherein said sampling and holding means comprise a plurality of identical circuits, each of said identical circuits comprising:

a first operational amplifier having a positive input for receiving one of said incoming analogical signals, a negative input and one output;

a first PNP transistor having a base connected to said output of the first operational amplifier, an emitter connected via a first resistor to the positive pole of a power supply and a collector directly connected to the negative pole of said power supply;

a first NPN transistor having a base connected to said output of the first operational amplifier, an emitter connected via a second resistor to said negative pole, and a collector directly connected to said positive pole;

a second NPN transistor having a base connected directly to the emitter of said first PNP transistor, a collector connected directly to said positive pole, and an emitter;

a second PNP transistor having a base connected directly to the emitter of said first NPN transistor, a collector connected directly to said negative pole, and an emitter;

a third and a fourth resistance serially connected between the emitters of said second NPN and PNP transistors; the connection between said third and fourth resistances defining a middle point connected to said negative input of the operational amplifier;

a second operational amplifier having a positive input earthed via a capacitor, a negative input, and an output connected to said negative input of the second operational amplifier for delivering one of said samples; and a plurality of parallel connected CMOS circuits for connecting, under the control of an external signal marking said beginning of the slope voltages, said middle point to said positive input of the second operational amplifier.

* * * * *